United States Patent

Hamada et al.

[11] Patent Number: 6,114,183
[45] Date of Patent: Sep. 5, 2000

[54] DISPLAY APPARATUS USING ELECTROLUMINESCENCE ELEMENTS AND METHOD OF MANUFACTURING SAME

[75] Inventors: Hiroki Hamada, Hirakata; Hiroyuki Kuriyama, Minoo; Shigeki Matsuta, Hirakata, all of Japan

[73] Assignee: Sanyo Electric Co., Ltd., Japan

[21] Appl. No.: 08/987,460

[22] Filed: Dec. 9, 1997

[30] Foreign Application Priority Data

Dec. 11, 1996 [JP] Japan .................................. 8-331187

[51] Int. Cl.[7] .............................. H01L 21/00; H01J 1/62; H01J 63/04
[52] U.S. Cl. ............................... 438/29; 313/504
[58] Field of Search ...................... 313/504, 503, 313/505; 438/29

[56] References Cited

U.S. PATENT DOCUMENTS

| | | | |
|---|---|---|---|
| 5,004,950 | 4/1991 | Lee | 313/582 |
| 5,194,290 | 3/1993 | Robertson | 427/526 |
| 5,523,770 | 6/1996 | Tanamachi | 345/60 |
| 5,804,917 | 9/1998 | Takahashi et al. | 313/504 |

FOREIGN PATENT DOCUMENTS

4-249095  9/1992  Japan .

*Primary Examiner*—Brian Dutton
*Attorney, Agent, or Firm*—Sheridan Ross P.C.

[57] ABSTRACT

A display apparatus having electroluminescense (EL) elements includes a light emitting layer for generating light. A high energy laser beam is irradiated on the luminous elemenent layer to define a plurality of regions of the light emitting layer. A plurality of first electrodes are arranged generally parallel to each other over a first surface of the light emitting layer and a plurality of second electrodes are arranged generally parallel to one another and perpendicular to the first electrodes on a second, opposite surface of the light emitting. The EL elements are formed at the intersections of the first and second electrodes.

15 Claims, 8 Drawing Sheets

DISPLAY APPARATUS USING ELECTROLUMINESCENCE ELEMENTS AND METHOD OF MANUFACTURING SAME

BACKGROUND OF THE INVENTION

The present invention relates to a display apparatus using electroluminescence elements, and a method of manufacturing the display apparatus.

Electroluminescence (EL) elements for use in a display apparatus include an inorganic EL element and an organic EL element. The inorganic EL element uses a thin film of an inorganic compound, like zinc selenide or zinc sulfide, as a fluorescent material, and the organic EL element uses an organic compound as a fluorescent material. Preferably, the organic EL element has the following features:

(1) A high external quantum efficiency.
(2) Light is emitted on a low driving voltage.
(3) Multifarious colors (green, red, blue, yellow, etc.) can be generated by selecting a proper fluorescent material.
(4) The display is clear and no back light is needed.
(5) There is no dependency on the viewing angle.
(6) The organic EL element is thin and light.
(7) A soft material like a plastic film can be used for the substrate.

Due to the aforementioned features, a display apparatus using such an organic EL elements (hereinafter referred to as "organic EL display apparatus") is a desirable replacement for a CRT or liquid crystal display.

An organic EL display apparatus employs a dot matrix system which displays an image with dots arranged in a matrix form. The dot matrix system includes a simple matrix system or an active matrix system.

The simple matrix system directly drives organic EL elements of a matrix of pixels, arranged on a display panel, in synchronism with a scan signal using an external driving unit. Each pixel on the display panel has only an organic EL element. As the number of scan lines of a display apparatus increases, therefore, the driving time (duty) assigned to each pixel decreases. This reduces the contrast as well as the luminance intensity of the display screen.

In the active matrix system, each of pixels arranged in a matrix form has an organic EL element and a pixel driving element (active elements). The pixel driving element serves as a switch which is switched on or off by the scan signal. A data signal (display signal, video signal) is transmitted to the anode of the associated organic EL element via an enabled pixel driving element. As the data signal is written in the organic EL element, the organic EL element is driven. Even when the pixel driving element is switch off state, the data signal previously applied to the anode of the organic EL element is held, in the form of a charge, in the organic EL element. The organic EL element is kept driven until the associated pixel driving element is switched on again. Even if the driving time per pixel driving element decreases as the number of scan lines is increased, therefore, the driving of the organic EL elements is not affected. Specifically, a sufficient luminance intensity is secured for an image to be displayed on the display panel and reduction in the contrast is prevented. The active matrix system can therefore provide display images with a higher quality than the simple matrix system.

Depending on the difference in pixel driving elements, display apparatuses of the active matrix system are classified into a transistor type (three-terminal type) and a diode type (two-terminal type). The transistor type is more difficult to manufacture than the diode type. On the other hand, the contrast and resolution of images which are displayed by the transistor type display apparatus can be improved easily. Therefore, the transistor type display apparatus provides high-quality images which match with those displayed by a CRT display. The following description on the operational principle of the active matrix system is mainly associated with the transistor type.

A conventional organic EL display apparatus 101 of the simple matrix system will now be discussed with reference to FIGS. 1 through 3.

Figure 1:
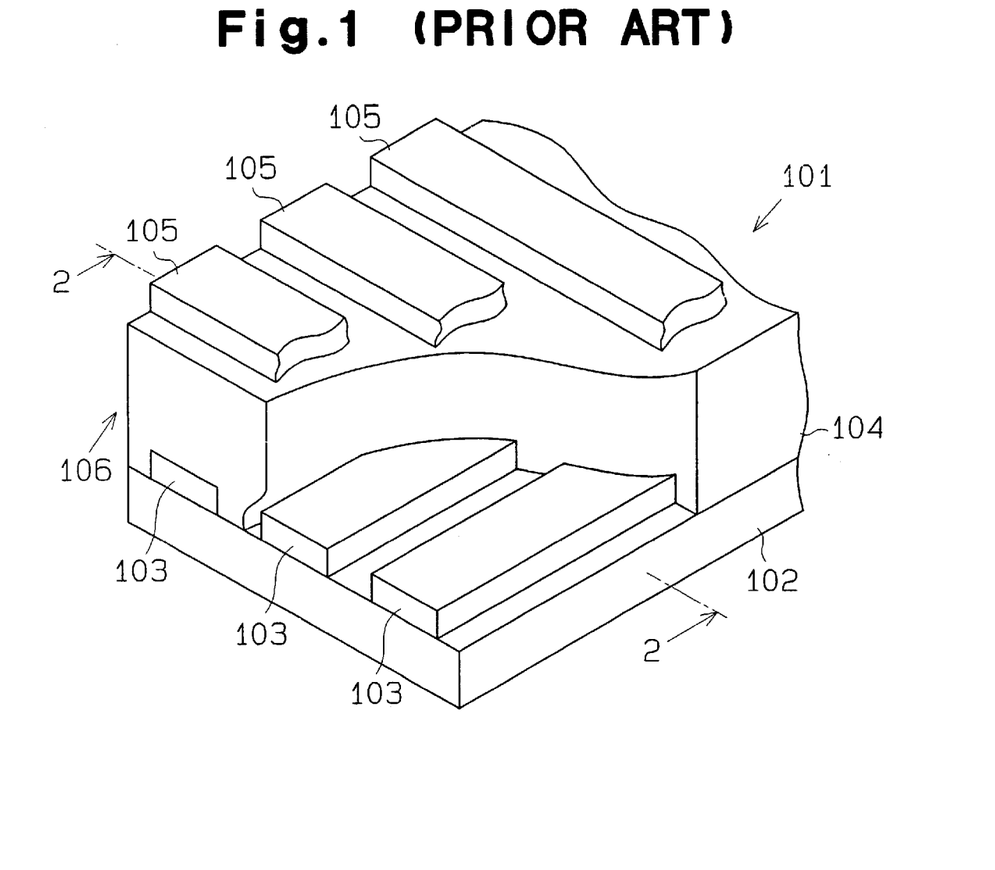
FIG. 1 is a perspective view showing a conventional organic EL display apparatus.
Figure 2:
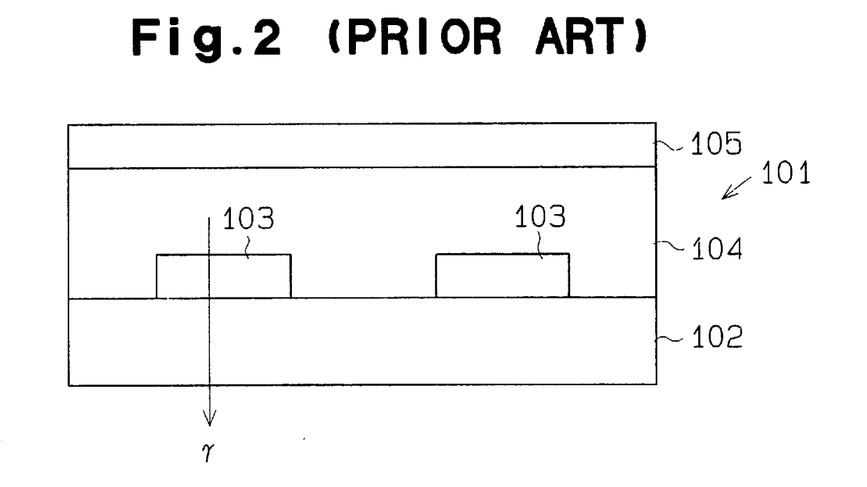
FIG. 2 is a cross-sectional view taken along the line 2—2 in FIG. 1.

As shown in FIG. 1, a plurality of anodes 103 are arranged, parallel to one another, on an insulator substrate 102, and a light emitting layer 104 is provided on the insulator substrate 102 to cover the anodes 103. A plurality of cathodes 105 are arranged, parallel to one another, on the light emitting layer 104. The anodes 103 are placed perpendicular to the cathodes 105. The light emitting layer 104, the anodes 103 and the cathodes 105 form an organic EL element 106. The insulator substrate 102 is preferably made of transparent glass, synthetic resin or the like. The anodes 103 are preferably formed of transparent electrodes of ITO (Indium Tin Oxide) or the like. The light emitting layer 104 is preferably formed of an organic compound. The cathodes 105 are preferably formed of a magnesium-indium alloy.

In the organic EL element 106, holes coming from the anodes 103 are recombined with electrons coming from the cathodes 105 inside the light emitting layer 104, emitting light. The light is emitted outside via the anodes 103 and the transparent insulator substrate 102 as indicated by the arrow γ in FIG. 2.

Figure 3:
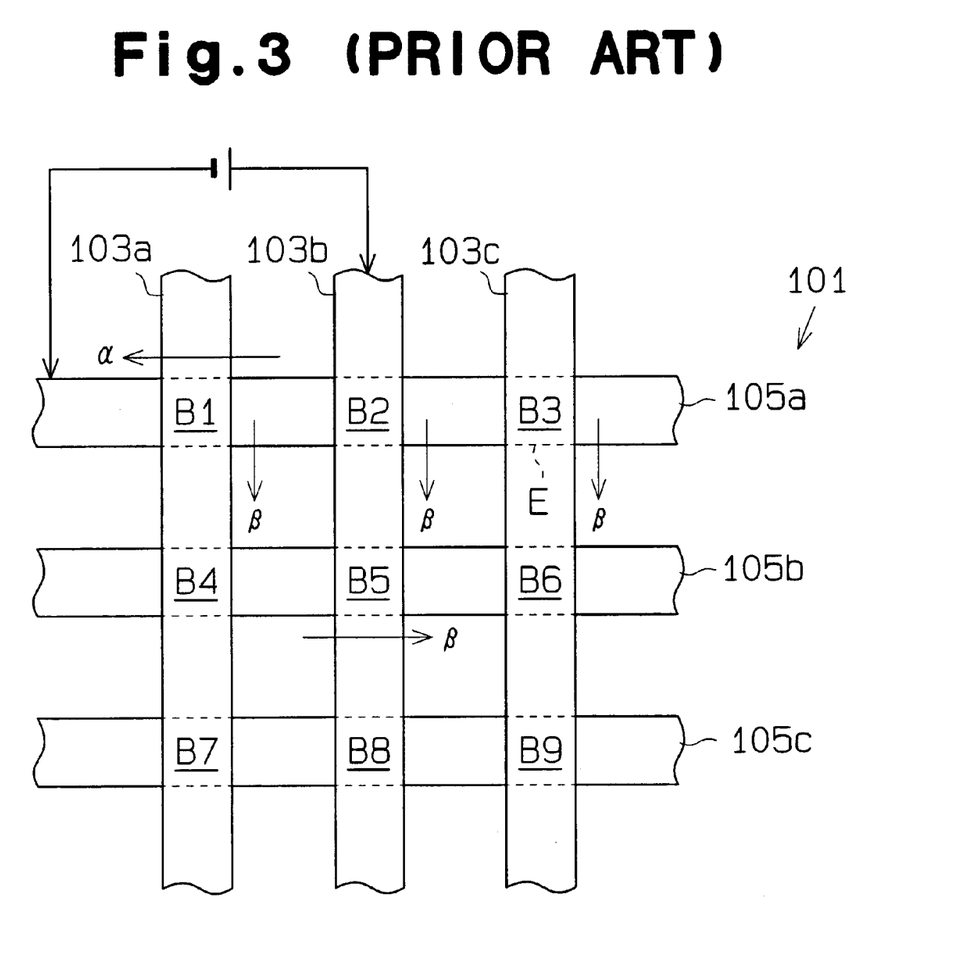
FIG. 3 is a plan view showing only the electrodes of the display apparatus of FIG. 1.

FIG. 3 is a schematic plan view of the organic EL display apparatus 101, as viewed from the anodes 103. In FIG. 3, only the anodes 103 and the cathodes 105 are illustrated.

Defined at the individual intersections of anodes 103a to 103c and cathodes 105a to 105c are light emitting areas B1 to B9 which emit light, as discussed above. That is, the light emitting areas B1–B9, arranged in a matrix form, form the organic EL display apparatus 101.

In the simple matrix system, the positive terminal of a driving power supply is connected to one anode 103, and the negative terminal of the driving power supply is connected to the corresponding cathode 105. In this manner, the anode 103 and the cathode 105 are energized.

In order for light emitting area B2 at the intersection of the anode 103b and the cathode 105a to emit light, for example, the positive terminal is connected to the anode 103b and the negative terminal is connected to the cathode 105a, and power is supplied through the terminals. As a result, a forward current flows, as indicated by the arrow γ.

Since the light emitting layer 104 is provided on the insulator substrate 102 so as to cover a plurality of anodes 103, a leak current flows, as indicated by the arrow β. The leak current energizes not only the light emitting area B2, but also the light emitting areas B1, B3 and B5 near the light emitting area B2. As a result, the light emitting areas B1, B3 and B5 emit light. This phenomenon is called an optical crosstalk caused by the leak current characteristic of the EL element 106. This shortcoming is inherent not only to the simple matrix system but also to the active matrix system and occurs in an inorganic EL display apparatus as well as an organic EL display apparatus.

The optical crosstalk deteriorates the contrast of images displayed by the organic EL display apparatus 101, disabling the acquisition of high-definition images. Particularly, a full-color organic EL display apparatus using EL elements causes color "smearing" and does not provide clear images.

Japanese Unexamined Patent Publication No. Hei 4-249095 discloses an EL element which prevents the occurrence of such a crosstalk as a solution to the aforementioned problem. In the EL element, a plurality of light emitting elements each comprised of an organic compound are provided apart from one another between a transparent electrode and a plurality of metal electrodes. Since the individual light emitting elements in the EL element are provided apart from one another, a crosstalk originating from the leak current does not occur. This makes an image to be displayed clearer.

As light emitting elements are made of an organic compound, they have poor water resistance. Therefore, the photolithography technology which uses cleaning water cannot be used in separating light emitting elements. The individual EL elements are thus formed directly using a metal mask. The use of the metal mask restricts the micro work of light emitting elements and gets in the way of improving the clearness of display images.

Accordingly, it is an object of the present invention to provide a display apparatus capable of displaying clear images and a method of manufacturing the same.

SUMMARY OF THE INVENTION

Briefly stated, the present invention provides a method of manufacturing a display apparatus, comprising the steps of: providing a light emitting layer for generating light; and irradiating a high-energy beam on said light emitting layer to define said light emitting layer into a plurality of regions.

The present invention further provides a method of manufacturing a display apparatus, comprising the steps of: providing a plurality of first electrodes generally parallel to one another; forming a light emitting layer for generating light on said first electrodes; irradiating said light emitting layer with a high-energy beam to define said light emitting layer into a plurality of regions; and forming a second electrode on said defined regions of said light emitting layer.

The present invention provides a method of manufacturing a display apparatus comprising the steps of: providing a plurality of first electrodes which extends generally parallel to one another; forming a light emitting layer of an organic compound for generating light on said first electrodes; irradiating said light emitting layer with a laser beam to define said light emitting layer into a plurality of regions; and forming a plurality of second electrodes on said defined regions of said light emitting layer which extend generally parallel to one another and generally perpendicular to said first electrodes.

The present invention further provides a display apparatus of an active matrix system comprising: a light emitting layer having a first surface and a second surface opposite to said first surface and defined into a plurality of regions; a plurality of first electrodes arranged, generally parallel to one another, over said first surface of said light emitting layer; a plurality of second electrodes arranged, generally parallel to one another and intersecting said first electrodes, over said second surface of said light emitting layer; electroluminescence elements formed at individual intersections of said first electrodes and said second electrodes; and driving elements, arranged in association with said electroluminescence elements, for driving the associated electroluminescence elements.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings.

DETAILED DESCRIPTION OF THE PREFERRED EMBODIMENTS

In the drawing, like numerals are used for like elements throughout.

First Embodiment

A display apparatus according to the first embodiment of the present invention will now be described with reference to FIGS. 4 through 6.

Figure 4:
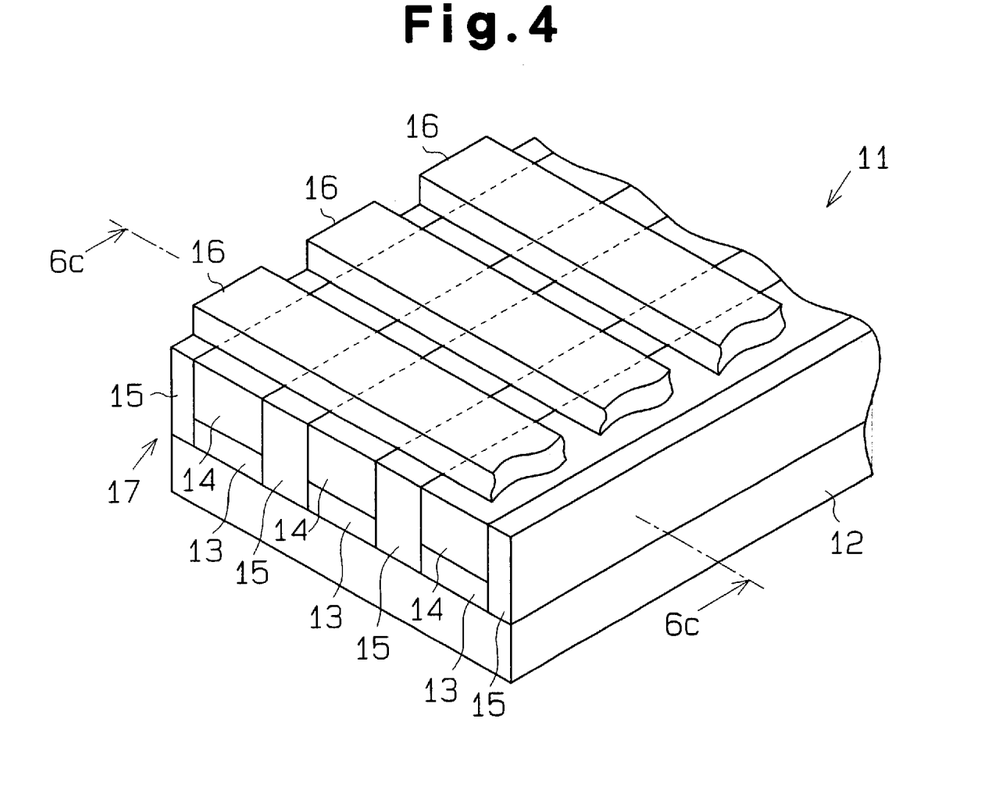
FIG. 4 is a perspective view of an organic EL display apparatus according to a first embodiment of the invention.

As shown in FIG. 4, an organic EL display apparatus 11 of the simple matrix system includes a transparent insulator substrate 12 of glass or a synthetic resin. A plurality of anodes 13 are formed generally parallel to one another on the substrate 12. The anodes 13 are formed of transparent electrodes preferably of ITO (Indium Tin Oxide). Light emitting layers 14 of an organic compound are respectively formed on the anodes 13.

A passivation layer 15 preferably made of SOG (Spin On Glass), is located in each space on the insulator substrate 12 between the adjoining light emitting layers 14. The individual passivation layers 15 define the light emitting layers 14 and isolate adjacent light emitting layers 14.

A plurality of band-like cathodes 16 of a by magnesium-indium alloy are formed on the passivation layers 15 and the light emitting layers 16 and extend generally be parallel to one another. The individual cathodes 16 extend in a direction generally perpendicular to the anodes 13, the light emitting layers 14 and the passivation layers 15. An organic EL element 17 comprises the light emitting layers 14, the anodes 13 and the cathodes 16.

The manufacturing process of the organic EL display apparatus 11 will now be described.

Figure 6A:
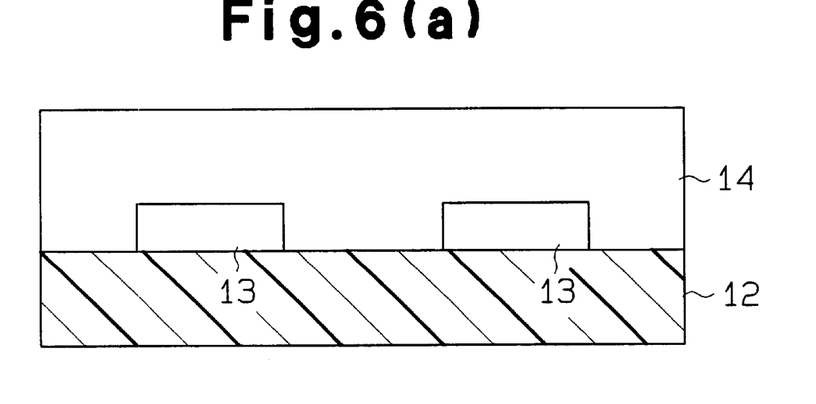
FIG. 6A is a cross-sectional view of the display apparatus showing a first manufacturing step.

As shown in FIG. 6A, the individual anodes 13 are formed on the insulator substrate 12, preferably by using sputtering, electron beam vapor deposition, atmospheric thermal CVD, spraying, dipping or plasma CVD. The light emitting layers 14 are formed on the insulator substrate 12 to cover the individual anodes 13 using electron beam vapor deposition. It is preferable that the anodes 13 to have a uniform thickness.

Figure 6B:
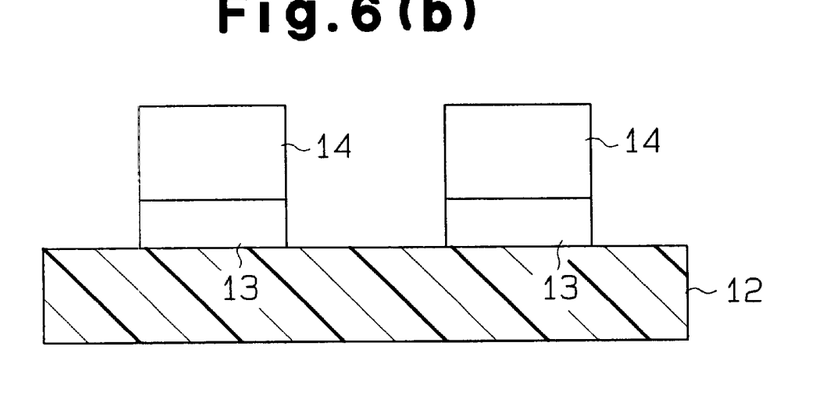
FIG 6B is a cross-sectional view of the display apparatus showing a second manufacturing step.

Then, a high-energy laser beam is irradiated such that a first portion of the light emitting layer 14 is located on each associated anode 13 and a second portion of the light emitting layer 14, excluding the first portion, is removed, as shown in FIG. 6B. As a result, the second portion of each light emitting layer 14 is removed, leaving the first portion of the light emitting layer 14 on the associated anode 13. The light emitting layers 14 on the respective anodes 13 are thus formed, preferably substantially parallel to one another, along the anodes 13.

Figure 5:
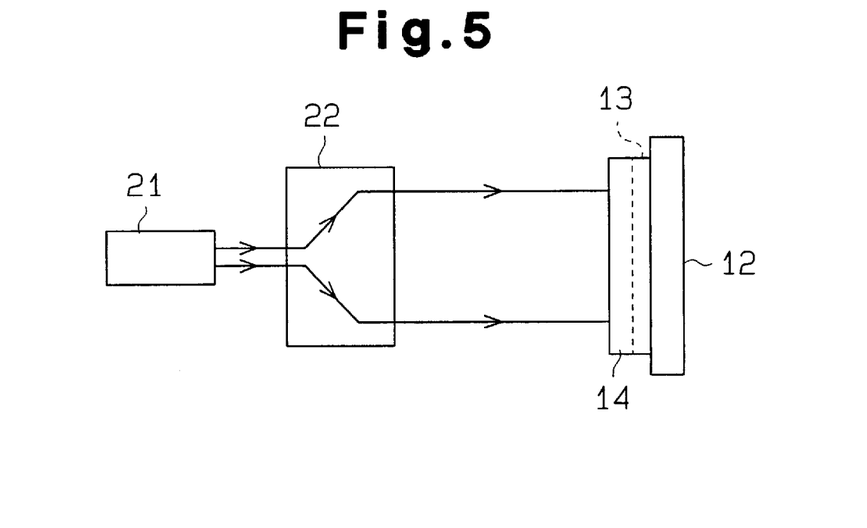
FIG. 5 is a schematic diagram illustrating a manufacturing step of the display apparatus of FIG. 4.

The laser beam is irradiated as shown in FIG. 5. The laser beam, emitted from a laser device 21, enters a beam expander 22. In this embodiment, a KrF excimer laser having a wavelength of 248 nm is used. The laser beam has an irradiation area of 10 mm×10 mm and energy of 600 mJ/cm². The laser beam is not limited to this particular one. For example, an ArF excimer laser with a wavelength of 193 nm, XeCl excimer laser with a wavelength of 308 nm, XeF excimer laser with a wavelength of 351 nm, copper vapor laser with a wavelength of 578 nm, Ar laser with a wavelength of 515 nm, the second harmonic of a YAG laser with a wavelength of 530 nm, or the like may be used as well. The light emitting layers 14 may be scanned with a laser beam directly to be removed or reformed without using the beam expander 22. To implement a uniform work, it is desirable to use a laser beam which has a certain, constant energy distribution characteristic. Further, an electron beam or ion-beam may be used in place of a high-energy laser beam.

The laser beam incident to the beam expander 22 is enlarged in the form of a thin slit, which increases the irradiation area of the laser beam. The beam expander 22 preferably comprises a pair of cylindrical lenses. The energy of the enlarged laser beam ranges from 10 to 500 mJ/cm². As the laser beam hits the second portion of each light emitting layer 14 between the anodes 13, the second portion is linearly and collectively removed.

Figure 6C:
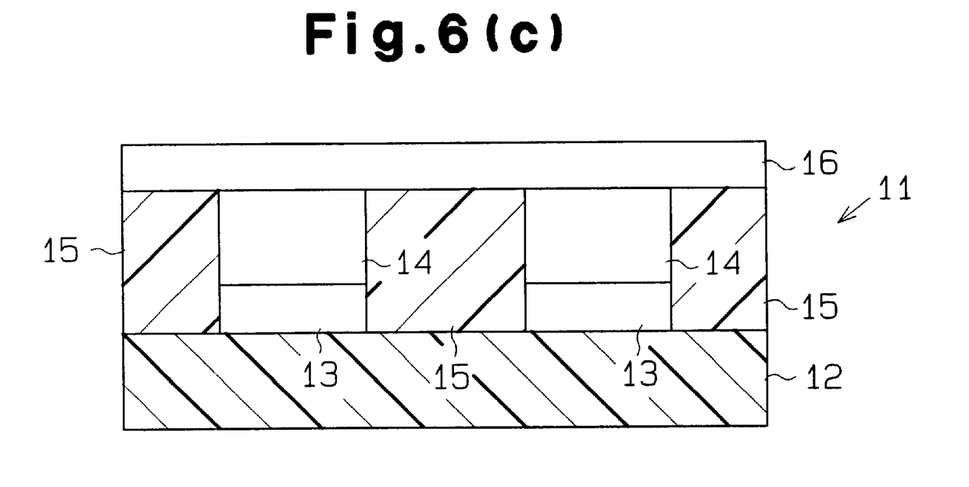
FIG. 6C is a cross-sectional view of the display apparatus taken along the line 4c—4c in FIG. 4, showing a third manufacturing step.

Then, the passivation layer 15, preferably of SOG, is formed between the adjoining light emitting layers 14, as shown in FIG. 6C. Then, the electrode layer, preferably of a magnesium-indium alloy, is formed uniformly and in a uniform thickness on the passivation layers 15 and the light emitting layers 14 preferably by electron beam vapor deposition. The electrode layer is cut by the aforementioned laser beam to form a plurality of cathodes 16, which run generally perpendicular to the anodes 13.

In the organic EL element 17 with the above-described structure, the holes coming from each anode 13 are recombined with the electrons coming from the associated cathode 16 inside the associated light emitting layer 14, and light is emitted outside from the transparent anode 13 via the transparent substrate 12. At this time, each light emitting layer 14 is defined and isolated by the passivation layers 15 so that no leak current flows from one light emitting layer 14 to another, which prevents the occurrence of a crosstalk and improves the clearness of displayed images.

The present embodiment uses a laser beam to define light emitting layers 14. The use of the laser beam facilitates the manufacturing process of the organic EL element 17 which is free of a crosstalk. Further, the use of the laser beam permits the fine removal of the second portions of the light emitting layers 14. Such micro work allows the organic EL element 17 having a high resolution to be manufactured.

Second Embodiment

Figure 7:
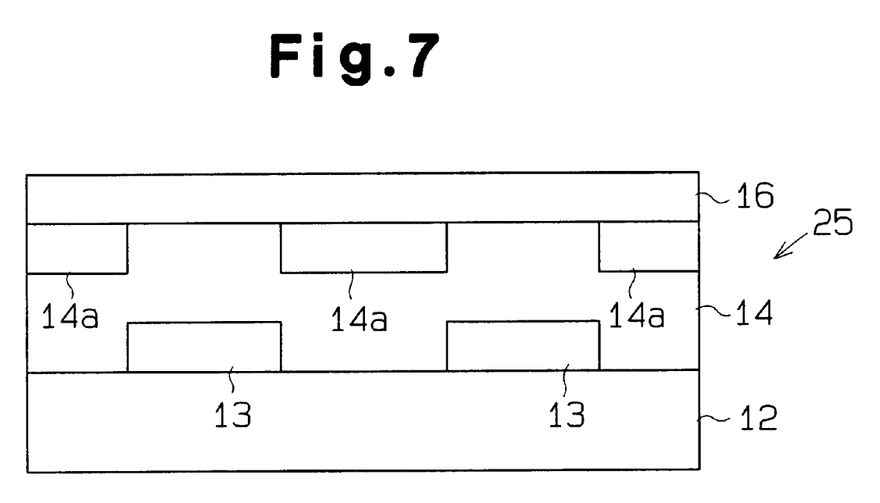
FIG. 7 is a cross-sectional view of an organic EL display apparatus according to a second embodiment of the present invention.

The second embodiment of this invention will be discussed below referring to FIG. 7.

In an organic EL display apparatus 25 according to the second embodiment, after a plurality of anodes 13 are formed on an insulator substrate 12, a light emitting layer 14 having a uniform thickness is formed on the substrate 12 to cover the anodes 13. A high-energy laser beam is locally irradiated on (second) portions of the light emitting layer 14, excluding first portions thereof on the anodes 13. The irradiated second portions are reformed to high-resistance portions 14a by the heat. The light emitting layer 14 is thus defined into a plurality of areas by the high-resistance portions 14a. In other words, the high-resistance portions 14a define the light emitting layer 14 on the associated anodes 13.

Then, a plurality of cathodes 16 are formed generally perpendicular to the anodes 13 on the light emitting layer 14 and the high-resistance portions 14a.

In the organic EL display apparatus 25 of the second embodiment, as per the first embodiment, the light generated by the light emitting layer 14 goes outside through the anodes 13 and the substrate 12. At this time, since the high-resistance portions 14a define the light emitting layer 14 on the respective anodes 13, no leak current flows from one portion of the light emitting layer 14 to another, which prevents the occurrence of crosstalk and leads to an improvement on the clearness of displayed images.

Third Embodiment

A third embodiment of the present invention will be discussed below with reference to FIGS. 8 through 10.

Figure 8:
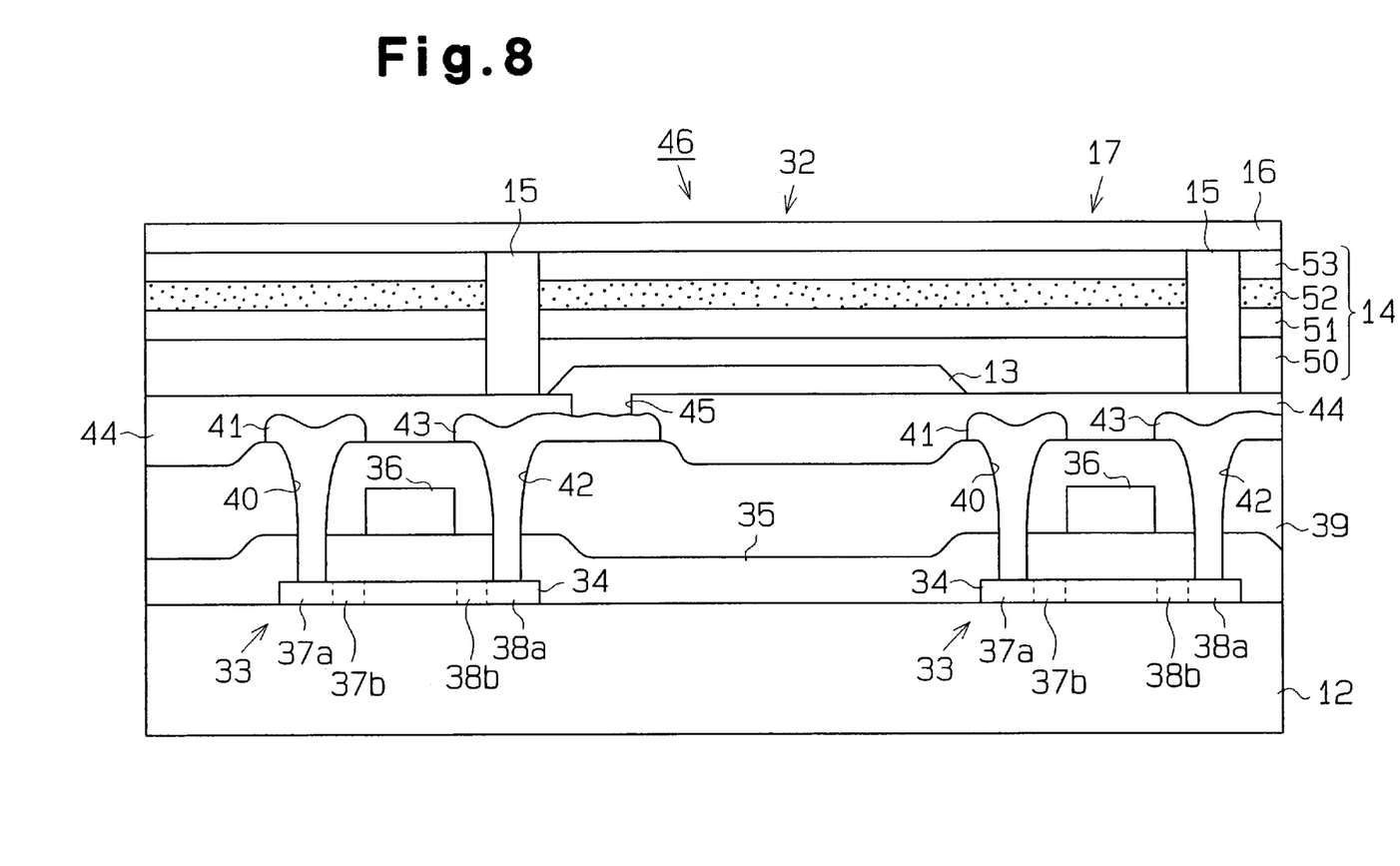
FIG. 8 is a cross-sectional view of an organic EL display apparatus according to a third embodiment of the present invention.

As shown in FIG. 8, each pixel 32 of an organic EL display apparatus 31 of the active matrix system has a thin film transistor (TFT) 33 as a pixel driving element. The TFT 33 is a planar type, and has an active layer comprised of a polycrystalline silicon film 34. The TFT 33 preferably has an LDD (Lightly Doped Drain) structure. The polycrystalline silicon film 34 is formed on an insulator substrate 12. A gate insulator film 35 is formed on the polycrystalline silicon film 34, with a gate electrode 36 formed on the gate insulator film 35. Defined on the polycrystalline silicon film 34 are a high-concentration drain region 37a, a low-concentration drain region 37b, a high-concentration source region 38a and a low-concentration source region 38b.

An interlayer insulator film 39 is formed on the TFTs 33. The high-concentration drain region 37a is connected to a drain electrode 41 via a contact hole 40 formed in the interlayer insulator film 39. The high-concentration source region 38a is connected to a source electrode 43 via a contact hole 42 formed in the interlayer insulator film 39.

A planarizing insulator film 44 is formed on the individual electrodes 41 and 43 and the interlayer insulator film 39. The source electrode 43 is connected to the associated anode 13 via a contact hole 45 formed in the planarizing insulator film 44.

Each of the insulator films 35 and 39 is preferably comprises a silicon oxide film, silicon nitride film or a silicon nitride oxide film. The planarizing insulator film 44 is preferably comprised of a silicon oxide film, a silicon nitride film, a silicon nitride oxide film, a silicate glass film, a SOG (Spin On Glass) film or a synthetic resin film (like a polyimide-based resin film, organic silica film or acrylic resin film). The electrodes 41 and 43 preferably comprise an aluminum alloy film.

A light emitting layer 14 is formed on the flattening insulator film 44. The light emitting layer 14 includes a first hole transporting layer 50, a second hole transporting layer 51, a light emitting layer 52 and an electron transporting layer 53. The layers 50–53 are preferably laminated, in order, on the insulator film 44. The first hole transporting layer 50 is preferably formed of MTDATA (4,4',4''-tris(3-methylphenylphenylamino)triphenyl amine). The second hole transporting layer 51 is preferably formed of TPD (4,4'-bis(3-methylphenylphenylamino)biphenyl). The light emitting layer 52 is preferably formed of BeBq2 (10-benzo[h]quinolinol-beryllium complex) containing a quinacridone derivative. The electron transporting layer 53 is preferably formed of BeBq2. The individual layers 50–53, the anodes 13 and the cathodes 15 form an organic EL element 17.

In the organic EL element 17 according to the third embodiment, holes and electrons are recombined inside the light emitting layer 52, generating light. The light goes outside via the anodes 13 and the insulator substrate 12.

The hole transporting layers 50 and 51 both facilitate the injection of the holes from the anodes 13. The electron transporting layer 53 facilitates the injection of the electrons from the cathodes 16.

According to the third embodiment, as apparent from the above, the organic EL element 17 emits green light and has a high external quantum efficiency. A display panel 46 comprised of the organic EL element 17 has an improved luminous intensity.

The color of light emitted by the organic EL element 17 varies depending on the property of the organic compound that forms the light emitting layer 52. It is preferable that OXD (oxadiazole) or AZM (azomethane-zinc complex) should be used for the emission of blue light, PYR (pyrazoline) is used for the emission of blue green light, Znq2 (8-quinolinol-zinc complex) should be used for the emission of yellow light, and ZnPr (porphyrin-zinc complex) should be used for the emission of red light.

Figure 9:
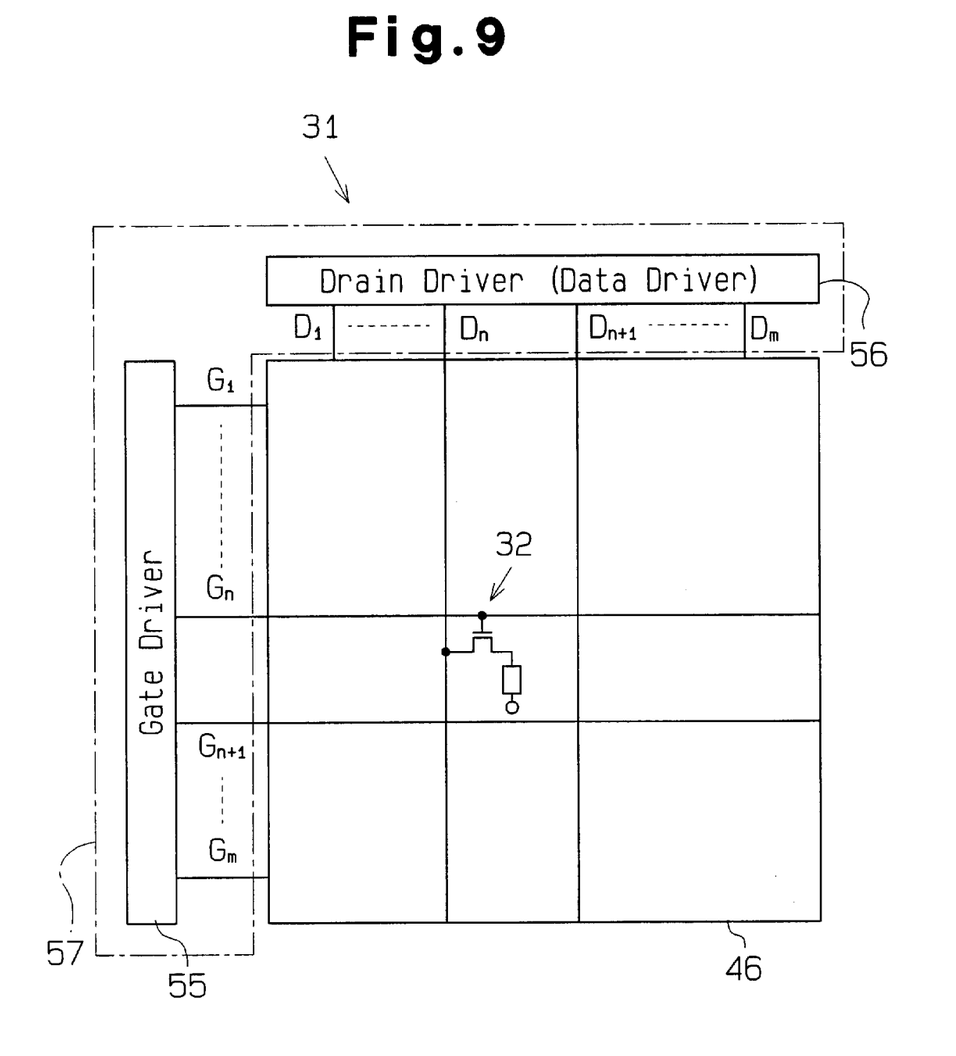
FIG. 9 is a block diagram illustrating the organic EL display apparatus of FIG. 8.

Referring now to FIG. 9, the circuit of the organic EL display apparatus 31 according to the third embodiment will be described. As shown, the organic EL display apparatus 31 includes the display panel 46, a gate driver 55, and a drain driver (data driver) 56.

The display panel 46 has a plurality of gate lines (scan lines) G1, ..., Gn, Gn+1, ..., and Gm, a plurality of drain lines (data lines) D1, ..., Dn, Dn+1, ..., and Dm. The gate lines G1–Gm perpendicularly cross the respective drain lines D1–Dm, with pixels 32 located at the individual intersections. That is, the pixels 32 on the display panel 46 are arranged in a matrix form.

The gate driver 55, connected to the individual gate lines G1–Gm, applies a gate signal (scan signal) to the gate lines G1–Gm. The drain driver 56, connected to the individual drain lines D1–Dm, applies a data signal thereto. The drivers 55 and 56 comprise a peripheral driving circuit 57. Each of the gate lines G1–Gm is comprised of the gate electrode 36 of each TFT 33. Each of the drain lines D1–Dm is comprised of the drain electrode 41 of each TFT 33.

Figure 10:
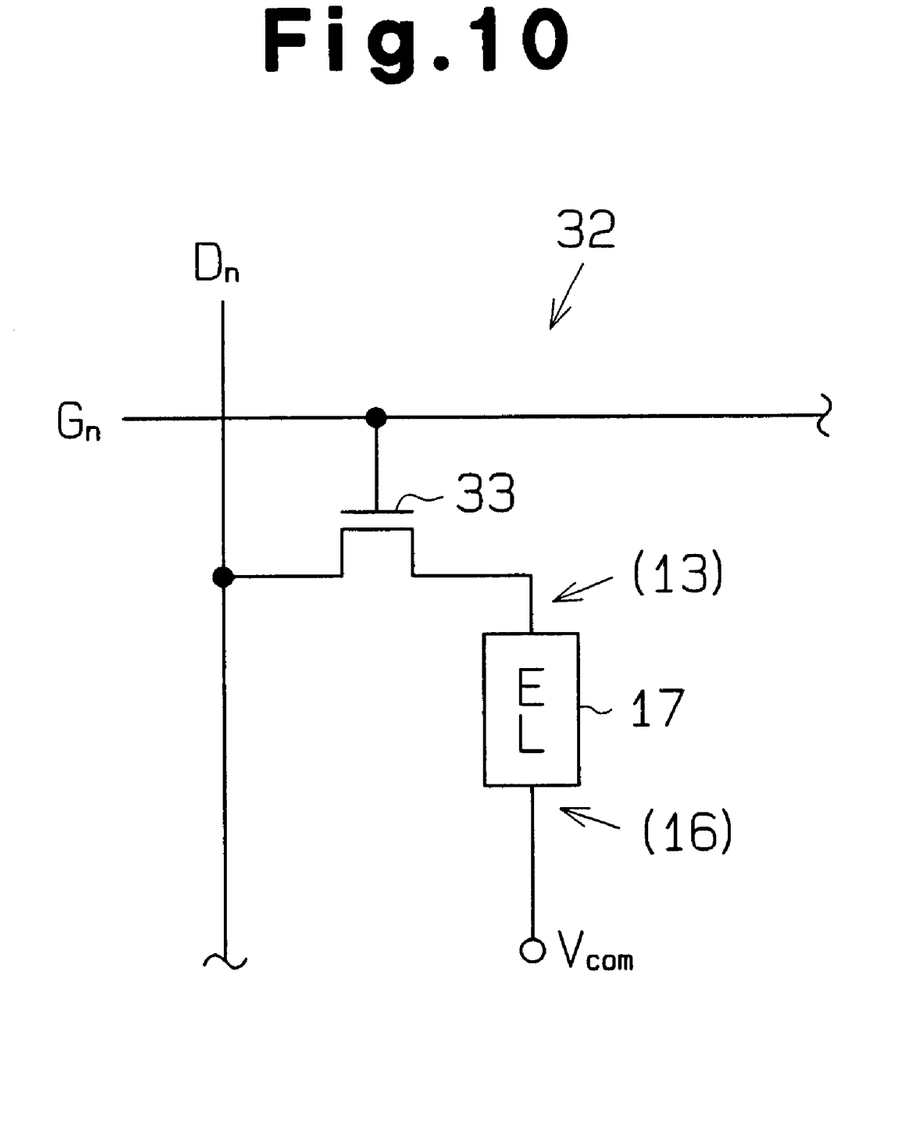
FIG. 10 is a schematic circuit diagram of an equivalent circuit showing a pixel of the organic EL display apparatus of FIG. 8.

FIG. 10 shows an equivalent circuit diagram of the pixel 32. A constant voltage Vcom is applied to the cathodes 16 of the organic EL element 17, which acts as a capacitor. When a positive voltage is applied to the gate electrode 36 of the TFT 33 with a positive voltage applied to the gate line Gn, the TFT 33 is turned on. As a result, capacitor of the organic EL element 17 is charged with a data signal applied to the drain line Dn, so that the data signal is written in the pixel 32. The organic EL element 17 is driven by the data signal.

When a negative voltage is applied to the gate electrode 36 of the TFT 33 by a negative voltage applied to the gate line Gn, the TFT 33 is turned off. At this time, the data signal, applied to the drain line Dn, is held in the form of a charge in the capacitor of the organic EL element 17. In this manner, an arbitrary data signal is held in each pixel 32 by inputting the data signal to each of the drain lines D1–Dm and controlling the voltage of each of the gate lines G1–Gm. The driving of the organic EL element 17 is maintained by the discharging of the capacitor until the TFT 33 is turned on again.

As mentioned in the "BACKGROUND OF THE INVENTION", when the number of gate lines (scan lines) is increased, the driving time assigned to one pixel 32 becomes shorter. According to the third embodiment, however, since a charge is stored between the anodes 13 and cathodes 16, light emission is not interrupted, which prevents the contrast of an image to be displayed on the display panel 46 from decreasing. The organic EL display apparatus 31 of the active matrix system can, therefore, ensure higher quality display than the organic EL display apparatus of the simple matrix system.

In the third embodiment, each TFT 33 has an active layer comprised of the polycrystalline silicon film 34 and is formed into an LDD structure. It is therefore possible to increase the ON/OFF ratio of the TFT 33 and suppress the leak current in the OFF state, which leads to an improved quality of display images.

According to the third embodiment, the high-concentration source region 38a is connected to the associated anode 13 via the source electrode 43 in order to provide a good ohmic contact between the high-concentration source region 38a and the anode 13. If the source electrode 43 is omitted, the high-concentration source region 38a, comprised of the polycrystalline silicon film 34, is directly connected to the anode 13 of ITO. Consequently, the hetero junction of the high-concentration source region 38a and the associated anode 13 generates an energy gap associated with the band gap difference. Naturally, a good ohmic contact cannot be provided. Unless there is a good ohmic contact between the high-concentration source region 38a and the associated anode 13, the data signal applied to any of the drain lines D1–Dm cannot accurately be written in the associated pixel 42, which lowers the image quality of the organic EL display apparatus 31.

The drain regions 37a and 37b may be called source regions, and the drain electrode 41 may be called a source electrode, in accordance with the type of the TFT 33 (P-type or N-type). In this case, the drain lines D1–Dm are called source lines, and the drain driver 56 a source driver.

According to the third embodiment, either the first hole transporting layer 50 or the second hole transporting layer 51 may be omitted, or both may be omitted. Alternatively, the electron transporting layer 53 may be omitted. The present invention can also be adapted to an organic EL element which has any of the aforedescribed element structures.

The TFT 33 may be replaced with a TFT which has an SD (Single Drain) structure or a double gate structure, instead of the LDD structure. Further, the TFT 33 may be replaced with a TFT of a reversed planar type, a staggered type or a reverse staggered type, in place of the planar type. Furthermore, the TFT 33 may have an active layer which is comprised of an amorphous silicon film.

It should be apparent to those skilled in the art that the present invention may be embodied in many other specific forms without departing from the spirit or scope of the invention. Particularly, it should be understood that the invention may be embodied in the following forms.

(1) The present invention may be embodied in an organic EL display apparatus which has a plurality of anodes and one cathode. In this case, the single cathode may have a band-like shape or a planar shape whose area corresponds to the area of all of the anodes. Further, the present invention may be embodied in an organic EL display apparatus which has one anode and a plurality of cathodes. In this case, the single anode may have a band-like shape or a planar shape whose area corresponds to the area of all the cathodes. In any of the aforementioned structures, after a plurality of electrodes (cathodes or anodes) are formed on the insulator substrate 12, the electrodes are separated by a laser beam. After the light emitting layer 14 is formed on the electrodes, one electrode (anode or cathode) is formed on the light emitting layer 14.

(2) The present invention may be adapted to a transistor type organic EL display apparatus of the active matrix system, which uses bulk transistors as pixel driving elements, or a diode type organic EL display apparatus of the active matrix system. Diode type pixel driving elements include an MIM (Metal Insulator Metal) diode, ZnO (Zinc Oxide) varistor, MSI (Metal Semi-Insulator) diode, BTB (Back to Back) diode and RD (Ring Diode).

(3) Further, the present invention may be adapted to a display apparatus which uses inorganic EL elements.

(4) A plurality of light emitting layers 14 may be defined to run perpendicular to the individual anodes 13. Parts of the light emitting layers 14 which are sandwiched between the individual anodes 13 and the associated cathodes 16 may be defined or arranged in a matrix form. The matrix arrangement prevents the occurrence of a crosstalk.

Therefore, the present examples and embodiments are to be considered as illustrative and not restrictive and the invention is not to be limited to the details given herein, but may be modified within the scope and equivalence of the appended claims.

What is claimed is:

1. A method of manufacturing a display apparatus comprising the steps of:
   providing a light emitting layer for generating light; and
   forming a plurality of first regions and a plurality of second regions, the first regions having a higher resistance than the second regions to inhibit crosstalk between adjacent second regions, wherein the forming step includes the step of irradiating a beam on said light emitting layer to define said light emitting layer into said plurality of first and second regions.

2. A method of manufacturing a display apparatus comprising the steps of:
   providing a light emitting layer for generating light;
   irradiating a beam on said light emitting layer to define said light emitting layer into a plurality of regions;
   arranging a plurality of first electrodes on a first surface of said light emitting layer; and
   forming a second electrode on a second surface of said light emitting layer opposite to said first surface.

3. A method of manufacturing a display apparatus comprising the steps of:
   providing a light emitting layer for generating light;
   irradiating a beam on said light emitting layer to define said light emitting layer into a plurality of regions;
   arranging a plurality of first electrodes on a first surface of said light emitting layer;
   forming a second electrode on a second surface of said light emitting layer opposite to said first surface; and
   irradiating a beam on said second electrode so that said second electrode perpendicularly crosses said first electrodes and is defined into a plurality of regions.

4. A method of manufacturing a display apparatus comprising the steps of:
   providing a plurality of first electrodes generally parallel to one another;
   forming a light emitting layer for generating light on said first electrodes;
   irradiating said light emitting layer with a beam to define said light emitting layer into a plurality of second regions that are defined between a plurality of first regions having a higher resistance than the second regions; and
   forming a second electrode on said defined regions of said light emitting layer.

5. The method according to claim 4, wherein said beam irradiating step includes a step of irradiating a beam on said light emitting layer to define said light emitting layer into generally parallel second regions on said first electrodes.

6. A method of manufacturing a display apparatus comprising the steps of:
   providing a plurality of first electrodes generally parallel to one another;
   forming a light emitting layer for generating light on said first electrodes;
   irradiating said light emitting layer with a beam to define said light emitting layer into a plurality of regions; and
   forming a second electrode on said defined regions of said light emitting layer, wherein said beam irradiating step includes a step of irradiating a beam on said light emitting layer to remove second portions of said light emitting layer excluding first portions thereof on said first electrodes.

7. A method of manufacturing a display apparatus comprising the steps of:
   providing a plurality of first electrodes generally parallel to one another;
   forming a light emitting layer for generating light on said first electrodes;
   irradiating said light emitting layer with a beam to define said light emitting layer into a plurality of regions, wherein said beam irradiating step includes a step of irradiating a beam on said light emitting layer to remove second portions of said light emitting layer excluding first portions thereof on said first electrodes;
   forming a second electrode on said defining regions of said light emitting layer; and arranging passivation layers in a space where said second portions of said light emitting layer are removed.

8. A method of manufacturing a display apparatus comprising the steps of:
   providing a plurality of first electrodes generally parallel to one another;
   forming a light emitting layer for generating light on said first electrodes;

irradiating said light emitting layer with a beam to define said light emitting layer into a plurality of first regions;

forming a second electrode on said defined regions of said light emitting layer; and irradiating a beam on said second electrode to define said second electrode into a plurality of second regions.

9. A method of manufacturing a display apparatus comprising the steps of:

providing a plurality of first electrodes generally parallel to one another;

forming a light emitting layer for generating light on said first electrodes;

irradiating said light emitting layer with a beam to define said light emitting layer into a plurality of first regions;

forming a second electrode on said defined regions of said light emitting layer; and irradiating a beam on said second electrode to define said second electrode into a plurality of second regions, wherein said step of irradiating a beam on said second electrode includes a step of irradiating a beam on said second electrode such that said second electrode crosses said first electrodes substantially perpendicularly.

10. A method of manufacturing a display apparatus comprising the steps of:

providing a plurality of first electrodes generally parallel to one another;

forming a light emitting layer for generating light on said first electrodes;

irradiating said light emitting layer with a beam to define said light emitting layer into a plurality of regions; and forming a second electrode on said defined regions of said light emitting layer, wherein said step of forming said light emitting layer includes a step of forming a layer of an organic compound.

11. A method of manufacturing a display apparatus comprising the steps of:

providing a plurality of first electrodes generally parallel to one another;

forming a light emitting layer for generating light on said first electrodes;

irradiating said light emitting layer with a beam to define said light emitting layer into a plurality of regions; and forming a second electrode on said defined regions of said light emitting layer, wherein said step of defining said light emitting layer includes a step of irradiating said light emitting layer with a laser beam.

12. A method of manufacturing a display apparatus comprising the steps of:

providing a plurality of first electrodes which extends generally parallel to one another;

forming a light emitting layer of an organic compound for generating light on said first electrodes;

irradiating said lumious element layer with a laser beam to define said light emitting layer into a plurality of regions; and forming a plurality of second electrodes on said defined regions of said light emitting layer which extend generally parallel to one another and generally perpendicular to said first electrodes.

13. The method according to claim 12, wherein said laser beam irradiating step includes a step of irradiating a laser beam on said light emitting layer to define said light emitting layer into generally parallel regions on said first electrodes.

14. The method according to claim 12, wherein said laser beam irradiating step includes a step of irradiating a laser beam on said light emitting layer to remove second portions of said light emitting layer, excluding first portions thereof on said first electrodes.

15. The method according to claim 12, wherein said laser beam irradiating step includes a step of irradiating a laser beam with a high-energy beam on said light emitting layer to reform a part of said light emitting layer to form a high-resistance portion, which defines said light emitting layer into a plurality of regions.

* * * * *